United States Patent

[11] 3,628,962

[72] Inventors Margaret H. Murray
Stamford, Conn.;
Robert M. Leekley, Appleton, Wis.

[21] Appl. No. 47,106
[22] Filed June 17, 1970
[45] Patented Dec. 21, 1971
[73] Assignee Time, Incorporated
New York, N.Y.
Continuation-in-part of application Ser. No. 633,731, Apr. 26, 1967, now abandoned. This application June 17, 1970, Ser. No. 47,106

[54] PHOTOSENSITIVE POLYAMIDE COMPOSITIONS
9 Claims, No Drawings

[52] U.S. Cl. .......... 96/115 R, 96/35.1
[51] Int. Cl. .......... G03c 1/70
[50] Field of Search .......... 96/115, 35.1

[56] References Cited

UNITED STATES PATENTS 2,997,391 8/1961 Murray et al. .......... 96/115 X

FOREIGN PATENTS 610,596 12/1960 Canada .......... 96/115

*Primary Examiner*—Ronald H. Smith
*Attorney*—Brumbaugh, Graves, Donohue & Raymond

ABSTRACT: Photosensitive compositions and printing plates formed therefrom wherein nylon is rendered photosensitive by the admixture therewith of a difunctional photoinitiator containing two nonadjacent or nonvicinal keto groups.

PHOTOSENSITIVE POLYAMIDE COMPOSITIONS

This application is a continuation-in-part of our copending U.S. application Ser. No. 633,731, filed Apr. 26, 1967, now abandoned.

The present invention relates in general to photosensitive compositions and to printing plates formed therefrom, and more particularly to photosensitive nylon compositions and printing plates formed from such compositions.

It has been proposed heretofore to utilize nylon which has been rendered photosensitive for the production of photosensitive printing plates. Such photosensitive nylon printing plates are employed in the preparation of planographic, gravure and relief printing plates by exposing the photosensitive nylon printing plate to a source of actinic light through an image-bearing transparency, such as a negative or a positive, to convert the light-exposed portions of the photosensitive plate to a developer-insoluble state while retaining the unexposed portions of the photosensitive plate in developer-soluble state and then treating the light-exposed photosensitive plate with a developer, such as methanol or ethanol, to remove the developer-soluble portions of the latent image thereon while retaining the developer-insoluble portions of the image on the plate. However, nylon is not photosensitive per se and hence must in some way be rendered photosensitive.

Nylon has been rendered sensitive to light heretofore by the incorporation therein of sensitizing adjuncts. For example, it has been proposed to treat nylon with an ionizable salt, such as ammonium dichromate, to render the nylon photosensitive. A further heretofore proposed method for rendering nylon photosensitive has been the blending with nylon of a vinylidene monomer, with or without a photoinitiator (U.S. Pat. No. 3,081,168). Another proposed method for imparting photosensitivity to nylon has been the incorporating within the nylon molecule of light-sensitive stilbene units (U.S. Pat. No. 2,997,391).

The objects of the present invention are to provide a further photosensitive nylon and printing plates using the photosensitive nylon.

The photosensitive composition of the invention contains two essential components, namely, nylon and a difunctional photoinitiator having two nonadjacent or nonvicinal keto groups therein.

The nylon component of the composition is a well-known material which is a photoinsensitive synthetic thermoplastic linear polyamide having recurring amide groups as an integral part of the main polymer chain. Suitable polyamides include those described in U.S. Pat. Nos. 2,071,250; 2,071,253; 2,130,523; 2,320,088; 2,430,860 and 2,441,057 and in J. Polymer Science, 2, 306–313, 412–419 (1947) and 3, 85–95 (1948). The nylon or polyamide is thus a condensation polymer of dicarboxylic acids and diamines or of their salts; of aminocarboxylic acids or their lactams; or of interpolymers comprising these two types of polymers. Examples thereof include epsilon-caprolactam polymers, sebacic acid-hexamethylene diamine polymers, adipic acid-hexamethylene diamine polymers and the interpolymers of epsilon-caprolactam with sebacic and/or adipic acid and hexamethylene diamine in varying proportions.

The preferred nylon or polyamide is an N-substituted polyamide, such as the hydroxyethyl or methoxymethylated nylons. Such N-substituted polyamides are preferred because they are rendered more photosensitive than the unsubstituted nylons or polyamides by the blending therewith of the difunctional photoinitiator.

The other component of the photosensitive composition is a difunctional photoinitiator containing two nonadjacent or nonvicinal keto groups. Representative suitable examples thereof include m-benzoylbenzophenone, $C_6H_5COC_6H_4COC_6$, p,p'-dibenzoyl diphenyloxide, $C_6H_5COC_6H_4OC_6COC_6H_5$; ethylene glycol ester of p-benzoyl benzoic acid $(C_6H_5COCH_4COOCH_2)_2$; diethylene glycol ester of p-benzoyl benzoic acid, $(C_6H_5COC_6H_4COOCH_2CH_2)_2o$; bis-2-(p-benzoyl phenoxy) ethyl ether, $(C_6H_5COC_6H_4OCH_2CH_2)_20$; m-dianisoylbenzene, $CH_3OC_6H_4CO(C_6H_4)COC_6H_4OCH_3$; N,N'-hexamethylene-bis-p,p'-benzoyl benzamide, $(C_6H_5COC_6H_4CONHCH_2CH_2CH_2)_2$; 1,6-dibenzoylhexane, $(C_6H_5COCH_2CH_2CH_2)$; 1,2-di(p-benzoylphenyl) ethane, $(C_6H_5COC_6H_4CH_2)2$; and 1,2-di(p-benzoylphenoxy) ethane, $(C_6H_5COC_6H_4OCH_2)_2$.

On the other hand, difunctional compounds having two keto groups adjacent or vicinal to or adjoining one another, as opposed to the difunctional compounds of the invention having two keto groups in nonadjacent or nonvicinal positions or relationship, cannot be utilized in the present invention as shown by the comparative data set forth hereinafter. Such unsuitable difunctional keto compounds having adjacent or vicinal keto groups are typified by benzil, $C_6H_5COCOC_6H_5$, and diacetyl or 2,3-butanedione, $CH_3COCOCH_3$.

The difunctional photoinitiator is used in an amount sufficient to render the nylon or polyamide photosensitive. The amount thereof will vary depending upon the chemical nature of the nylon or polyamide component of the photosensitive composition, the activity of the difunctional photoinitiator and the thickness of the layer of photosensitive composition used in a photosensitive printing plate. In general, however, from about 0.7 to about 6 parts or more by weight of the difunctional photoinitiator are used for each 100 parts by weight of the nylon or polyamide component of the photosensitive composition.

The photosensitive compositions of the invention can be prepared by physically blending together the nylon or polyamide and the difunctional photoinitiator. Alternatively, the nylon or polyamide and difunctional photoinitiator can be dissolved in a mutual solvent therefor, such as methanol, ethanol and dimethyl formamide, and the solution of the two components cast as a sheet or film which is dried to form thereby a photosensitive printing plate.

The products of the invention are further illustrated by the following nonlimiting examples.

Examples 1–6

The comparative photosensitivity of nylon per se, physical mixtures of nylon with benzophenone (a representative known light-sensitive monofunctional photoinitiator having one keto group therein), physical mixtures of nylon with either benzil or diacetyl (typical difunctional compounds having two adjacent or vicinal keto groups therein) and physical mixtures of the invention made from nylon plus a difunctional photoinitiator having two nonadjacent or nonvicinal keto groups therein was determined in accordance with the following test procedure. A methanol solution containing 15 percent by weight of the nylon composition to be tested was cast on a glass plate maintained at 32° C. and spread evenly with a drawdown applicator having a 0.024 inch clearance. The film was substantially air dried at 32° C. Separate samples of the cast film were exposed for 3, 6, 9, 12 and 18 minutes to a General Electric Company UA11 mercury vapor lamp at 4-inch distance from the film. The exposed film was weighed and then immersed in boiling methanol for a period of 4 minutes. The exposed film was removed from the methanol, oven dried at 60° C. and weighed again. The quotient of the final weight divided by the initial weight multiplied by 100 represents the percent of the tested nylon composition which had been rendered insoluble in boiling methanol by exposure to an actinic light source and therefore is a direct measure of the photosensitivity of the various tested nylon compositions.

The results of this comparative photosensitivity test are set forth in the following table I. In table I Zytel 61 nylon is a commercial interpolymer of hexamethylene diammonium adipate, hexamethylene diammonium sebacate and epsilon-caprolactam, having a molecular weight of about 20,000; and DV 55 nylon is an N-methoxymethylated polyamide of similar molecular weight. In table I the difunctional photoinitiators of the invention have been coded as follows:

| Code | Difunctional Photoinitiator of the Invention |
|---|---|
| A | m-benzoylbenzophenone, $C_6H_5COC_6H_4COC_6H_5$ |
| B | p,p'-dibenzoyl diphenyloxide, $C_6H_5COC_6H_4OC_6H_4COC_6H_5$ |

| | |
|---|---|
| C | ethylene glycol ester of p-benzoyl benzoic acid, $(C_6H_5COC_6H_4COOCH_2)_2$ |
| D | diethylene glycol ester of p-benzoyl benzoic acid, $(C_6H_5COC_6H_4COOCH_2CH_2)_2O$ |

Also in table I typical difunctional compounds having two adjacent or vicinal keto groups, and hence not within the present invention, have been coded as follows:

| Code | Difunctional Comparative Compounds |
|---|---|
| X | benzil, $C_6H_5COCOC_6H_5$ |
| Y | diacetyl, $CH_3COCOCH_3$ |

TABLE I

| Ex. No. | Nylon | Parts | Photo-initiator [1] | Parts | Percent insoluble 3 min. | 6 min. | 9 min. | 12 min. | 18 min. |
|---|---|---|---|---|---|---|---|---|---|
| 0 | Zytel 61 | 100 | None | | | 0 | | 0 | 0 |
| 1 | do | 100 | Benzophenone | 0.69 | | 0 | | 0 | 0 |
| 2 | do | 100 | do | 1.30 | | 0 | | 0 | 0 |
| 3 | do | 100 | do | 2.8 | | 0 | | 0 | 0 |
| 4 | do | 100 | do | 5.5 | | 0 | | 28 | 29 |
| 1A | do | 100 | A | 0.53 | | 0 | | 0 | 0 |
| 2A | do | 100 | A | 1.01 | | 0 | | 37 | 48 |
| 3A | do | 100 | A | 2.17 | | 18 | | 64 | 71 |
| 4A | do | 100 | A | 4.35 | | 21 | | 64 | 73 |
| 5 | do | 100 | Benzophenone | 3.3 | | 0 | | 0 | 0 |
| 5D | do | 100 | D | 4.65 | | 7 | | 44 | 54 |
| 5X | do | 100 | X | 1.91 | | 0 | | 0 | |
| 5Y | do | 100 | Y | 0.8 | | 0 | | 0 | |
| 00 | DV 55 | 100 | None | | 0 | 0 | 0 | 0 | 0 |
| 6 | DV 55 | 100 | Benzophenone | 1.1 | 0 | 0 | 0 | 0 | 15 |
| 6A | DV 55 | 100 | A | 0.9 | | | | 53 | |
| 6B | DV 55 | 100 | B | 1.15 | 14 | 15 | 18 | 26 | 33 |
| 6C | DV 55 | 100 | C | 0.8 | | | | 59 | |
| 6D | DV 55 | 100 | D | 1.5 | | | | 65 | |

[1] Different photoinitiators compared at equivalent concentrations of keto function within any given sequence of examples.

The comparative data set forth in the above table I establish that unsubstituted and N-substituted nylons per se are not photosensitive as shown by the fact that none of the light-exposed nylon in examples 0 and 00 was insoluble in boiling methanol. The comparative data for unlettered examples 1 through 6 establish that mixtures of nylon with benzophenone (a representative known monofunctional photoinitiator having only one keto group) have no or only limited photosensitivity as shown by the fact that only from 0 to 29 percent of these physical mixtures was rendered insoluble in boiling methanol after exposure thereof to actinic light. The comparative data for lettered examples 5X and 5Y establish that mixtures of nylon with either benzil or diacetyl (representative difunctional compounds having two adjacent or vicinal keto groups) have no photosensitivity as shown by the fact that 0 percent of these physical mixtures was rendered insoluble in boiling methanol after exposure thereof to actinic light. On the other hand, however, lettered examples 1A, 2A, 3A, 4A, 5D, 6A,6B, 6C and 6D clearly establish that the photosensitive compositions of the invention made up of nylon plus a difunctional photoinitiator containing two nonadjacent or nonvicinal keto groups have increased photosensitivity as shown by the fact that from 7 to 73 percent thereof was rendered insoluble in boiling methanol after exposure thereof to actinic light.

It will be appreciated in comparing the relative photosensitivity of mixtures of nylon with either a monofunctional photoinitiator, as exemplified by benzophenone, or a difunctional compound having two adjacent or vicinal keto groups, as exemplified by benzil and diacetyl (coded compounds X and Y), and of the compositions of the invention made up of nylon plus a difunctional photoinitiator having two nonadjacent or nonvicinal keto groups, as exemplified by the coded compounds A through D, that the only proper comparison is between an unlettered comparative example and the same numbered-lettered example. It is important to note that such a comparison establishes an unexpectedly high light sensitizing activity for the compositions of the invention, since the monofunctional and difunctional compounds or photoinitiators were used at equivalent concentrations of keto groups within any given sequence of examples. At such equivalent concentrations it would have been expected that similar photosensitivity would have resulted and yet much greater photosensitivity was achieved by the difunctional photoinitiators having two nonadjacent or nonvicinal keto groups than by the monofunctional photoinitiator or the difunctional compounds having two adjacent or vicinal keto groups at identical light exposure times.

Although this unexpected phenomenon is not clearly understood at this time, the following theoretical explanation is a possibility. With monofunctional photoinitiators, such as benzophenone or $\Phi_2CO$, this sequence of reactions may occur:

$$\varphi_2CO \xrightarrow{\text{light}} \phi_2CO^* \quad (1)$$

$$\phi_2CO^* + \text{nylon} \longrightarrow \phi_2\dot{C}OH + \text{nylon} \quad (2)$$

$$\text{nylon.} + \text{nylon.} \longrightarrow \text{nylon crosslink} \quad (3)$$

$$\phi_2\dot{C}ON + \text{nylon.} \longrightarrow \phi_2 \text{—}\underset{\substack{|\\ OH}}{C}\text{—} \text{ nylon} \quad (4)$$

Reaction 4 is undesirable for high cross-linking efficiency because it wastes two active species. However, with a difunctional photoinitiator having two nonadjacent or nonvicinal keto groups, the reaction product in reaction 4 can still contribute to cross-linking of nylon via participation of the second keto group in the scheme suggested above. Why there is such a marked difference in the photoinitiator or photosensitizing activity between difunctional compounds having two adjacent or vicinal keto groups and the difunctional compounds of the invention having two nonadjacent or nonvicinal keto groups is not thoroughly understood at this time.

The photosensitive nylon compositions of the invention are valuable in forming printing plates and films made wholly of the photosensitive nylon compositions. Such plates and films are photosensitive throughout. The present invention also makes possible the formation of coated printing plates on any base by the deposition by any known process of films or coatings of the photosensitive nylon compositions thereon. Typical bases are metal sheets, sheets made of synthetic resins and cellulose derivatives, fabrics, paper and leather. The plates formed wholly of or coated with the photosensitive nylon compositions are useful in photography, photomechanical reproductions, lithography, and intaglio printing. More specific examples of such uses are offset printing, silk screen printing, duplicating pads, manifold stencil sheeting coatings, lithographic plates, relief plates and gravure plates.

It will thus be seen that the present invention provides novel and highly useful photosensitive nylon compositions and printing plates formed therefrom which have application to the printing industry. Since various modifications and changes may be made in the products of the invention without departing from the essence thereof, the invention is to be limited only within the scope of the appended claims.

What is claimed is:

1. A photosensitive composition consisting essentially of a photoinsensitive synthetic thermoplastic linear polyamide having recurring amide groups as an integral part of the main polymer chain and a difunctional photoinitiator having two nonadjacent keto groups therein in an amount sufficient to render the polyamide photosensitive.

2. The photosensitive composition defined by claim 1 wherein the amount of difunctional photoinitiator is from about 0.7 to about 6 parts by weight per 100 parts by weight of the polyamide.

3. The photosensitive composition defined by claim 1 wherein the difunctional photoinitiator is m-benzoyl benzophenone.

4. The photosensitive composition defined by claim 1 wherein the difunctional photoinitiator is p,p'-dibenzoyl diphenyloxide.

5. The photosensitive composition defined by claim 1 wherein the difunctional photoinitiator is ethylene glycol ester of p-benzoyl benzoic acid.

6. The photosensitive composition defined by claim 1 wherein the difunctional photoinitiator is diethylene glycol ester of p-benzoyl benzoic acid.

7. The photosensitive composition defined by claim 1 wherein the polyamide is an N-methoxymethylated polyamide.

8. The photosensitive composition defined by claim 1 wherein the polyamide is an N-hydroxyethyl polyamide.

9. A photosensitive printing plate having the photosensitive composition defined by claim 1 as a photosensitive component thereof.

* * * * *

PO-1050
(5/69)

UNITED STATES PATENT OFFICE
CERTIFICATE OF CORRECTION

Patent No. 3,628,962 Dated Dec. 21, 1971

Inventor(s) Margaret H. Murray and Robert M. Leekley

It is certified that error appears in the above-identified patent and that said Letters Patent are hereby corrected as shown below:

Col. 1, line 70, "$H_4COC_6$" should be --$H_4COC_6H_5$--; line 71, "$COC_6H_5$" should be --$H_4COC_6H_5$--; line 72, "$(C_6H_5COCH_4COOCH_2)_2$" should be --$(C_6H_5COC_6H_4COOCH_2)_2$--. Col. 2, line 3, "$CH_2CH_2)$" should be --$CH_2CH_2)_2$--. Col. 4, line 42, "$\phi_2\overset{O}{C}ON$" should be --$\phi_2\overset{O}{C}OH$--.

Signed and sealed this 23rd day of May 1972.

(SEAL)
Attest:

EDWARD M.FLETCHER,JR.
Attesting Officer

ROBERT GOTTSCHALK
Commissioner of Patents